(12) United States Patent
Karpyuk et al.

(10) Patent No.: US 11,976,354 B2
(45) Date of Patent: May 7, 2024

(54) METHOD FOR PRODUCING CERAMIC MULTILAYERED TUBE USED AS CLADDING FOR FUEL ELEMENT IN NUCLEAR POWER PLANT

(71) Applicant: BOCHVAR HIGH-TECHNOLOGY RESEARCH INSTITUTE FOR INORGANIC MATERIALS, Moscow (RU)

(72) Inventors: Leonid Aleksandrovich Karpyuk, Moscow (RU); Vladislav Konstantinovich Orlov, Moscow (RU); Sergey Igorevich Ivanov, Moscow (RU); Alexey Vladimirovich Glebov, Moscow (RU); Fyodor Viktorovich Makarov, Putilkovo Village (RU); Roman Gennadyevich Zakharov, Moscow (RU); Ivan Alexandrovich Dzyubinsky, Moscow (RU); Alexander Pavlovich Ponomarenko, Moscow (RU); Alexander Dmitrievich Bagdatyev, Elektrosal (RU)

(73) Assignee: BOCHVARI HIGH-TECH. RES. INST. FOR INORG. MATERIALS, Moscow (RU)

( * ) Notice: Subject to any disclaimer, the term of this patent is extended or adjusted under 35 U.S.C. 154(b) by 143 days.

(21) Appl. No.: 17/637,064

(22) PCT Filed: Dec. 29, 2020

(86) PCT No.: PCT/RU2020/000773
§ 371 (c)(1),
(2) Date: Feb. 21, 2022

(87) PCT Pub. No.: WO2022/103297
PCT Pub. Date: May 19, 2022

(65) Prior Publication Data
US 2022/0356564 A1 Nov. 10, 2022

(30) Foreign Application Priority Data

Nov. 10, 2020 (RU) ................................ 2020136804

(51) Int. Cl.
*C23C 16/32* (2006.01)
*C04B 41/00* (2006.01)
(Continued)

(52) U.S. Cl.
CPC .......... *C23C 16/325* (2013.01); *C04B 41/009* (2013.01); *C04B 41/4531* (2013.01);
(Continued)

(58) Field of Classification Search
CPC .......... G21C 3/07; D04C 1/12; C23C 16/325; C04B 41/009; C04B 41/4531; C04B 41/5001; C04B 41/5059; Y10T 29/49982
See application file for complete search history.

(56) References Cited

U.S. PATENT DOCUMENTS

2009/0032178 A1 2/2009 Feinroth
2016/0049211 A1 2/2016 Feinroth et al.

FOREIGN PATENT DOCUMENTS

RU 2481654 C1 5/2013
RU 2504030 C2 1/2014
(Continued)

*Primary Examiner* — Jermie E Cozart
(74) *Attorney, Agent, or Firm* — Craft Chu PLLC; Andrew W. Chu

(57) ABSTRACT

The method includes forming an inner monolithic layer from crystals of beta phase stoichiometric silicon carbide on a carbon substrate in the form of a rod by chemical methylsilane vapor deposition in a sealed tubular hot-wall CVD reactor. The method further includes forming a central composite layer over the inner monolithic layer by twisting continuous beta phase stoichiometric silicon carbide fibers into tows, transporting the tows to a braiding machine, and forming a reinforcing thread framework. A pyrocarbon inter- (Continued)

face coating is built up by chemical methane vapor deposition in a sealed tubular hot-wall CVD reactor. Then, a matrix is formed by chemical methylsilane vapor deposition in the reactor. A protective outer monolithic layer is formed from crystals of beta phase stoichiometric silicon carbide over the central composite layer by chemical methylsilane vapor deposition in a CVD reactor. And then the carbon substrate is removed from the fabricated semi-finished product.

15 Claims, 4 Drawing Sheets

(51) Int. Cl.
| | |
|---|---|
| C04B 41/45 | (2006.01) |
| C04B 41/50 | (2006.01) |
| C04B 41/52 | (2006.01) |
| C04B 41/87 | (2006.01) |
| C23C 16/01 | (2006.01) |
| C23C 16/26 | (2006.01) |
| D04C 1/02 | (2006.01) |
| D04C 1/12 | (2006.01) |
| G21C 3/07 | (2006.01) |

(52) U.S. Cl.
CPC ...... *C04B 41/5001* (2013.01); *C04B 41/5059* (2013.01); *C04B 41/522* (2013.01); *C04B 41/87* (2013.01); *C23C 16/01* (2013.01); *C23C 16/26* (2013.01); *D04C 1/02* (2013.01); *D04C 1/12* (2013.01); *G21C 3/07* (2013.01); *D10B 2101/16* (2013.01); *D10B 2505/02* (2013.01); *Y10T 29/49982* (2015.01)

(56) References Cited

FOREIGN PATENT DOCUMENTS

| | | |
|---|---|---|
| RU | 2575863 C1 | 2/2016 |
| RU | 2720579 C1 | 5/2020 |

METHOD FOR PRODUCING CERAMIC MULTILAYERED TUBE USED AS CLADDING FOR FUEL ELEMENT IN NUCLEAR POWER PLANT

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The invention relates to nuclear power engineering, in particular to development of a method for producing hermetic, high-temperature, silicon-carbide, composite structural materials and products in the form of cladding tubes and their end plugs that may be used for containment of fissionable fuel in fuel elements used in existing nuclear power plants.

2. Description of Related Art Including Information Disclosed Under 37 CFR 1.97 and 37 CFR 1.98

In accordance with requirements to fuel claddings that are usually manufactured from zirconium or steel alloys, a ceramic composite cladding tube should provide effective heat transfer from contained uranium fuel to an external coolant and provide tightness and strength characteristics so that all radioactive gases and solid fission products are held within the tube and are not discharged into the coolant during normal operation of a reactor or during possible emergencies.

A fuel element for nuclear pressurized water reactors and a method of making said fuel element are known in the art (Patent RU 2481654, IPC G21C 3/00, publ. 10 May 2013). According to the invention, a fuel element cladding tube is manufactured from alternating layers of nanocrystalline silicon carbide and separating layers of a high-temperature material whose structure is different from that of silicon carbide, and plugs on both ends of the tube are manufactured from silicon carbide which prevents penetration of gases through the plugs. The method of manufacturing said fuel element is based on heating a graphite rod to temperature of 1300-1600° C. in a gas mixture corresponding to the tube layer material and on alternate replacement of this mixture for forming another layer of the tube. To form a nanocrystalline silicon carbide layer, a gas mixture is used that comprises silicon and carbon hydrides and chlorides.

A disadvantage of this invention is that mechanical strength properties of the product are insufficient due to possibility of product brittle failure when applying a load, since it lacks an intermediate strengthening layer of reinforcing fibers. Other physical and mechanical properties of this invention cannot be studied, since the patent specification does not contain any data thereon.

A nuclear fuel shell with high specific heat conductivity and a method of its production are known in the art (Patent RU 2504030, IPC G21C 3/07, publ. 10 Jan. 2014). The shell is fully or partially made of a composite material with a ceramic matrix containing fibers of silicon carbide (SiC) as reinforcement of the matrix and a phase-to-phase layer between the matrix and fibers. The matrix contains at least one carbide selected from titanium carbide (TiC), zirconium carbide (ZrC) or triple carbide of titanium-silicon (Ti3SiC2). The method for manufacturing the nuclear fuel shell comprises, in particular, making a fiber pre-form, applying said phase-to-phase layer thereon using the technique of chemical vapor infiltration, applying the matrix.

A disadvantage of this invention is negative influence of introduced impurity elements having a high value of thermal-neutron capture cross-section on neutron-physical characteristics of final products operated in VVER-type reactors (water-moderated water-cooled power reactors); in particular, introduction of refractory metal carbides into the matrix structure to stabilize performance of the product when it is operated in so-called fast-neutron "high-temperature" reactors (FNRs) (operating temperatures above 800° C.) where helium as gas coolant is used (so-called "He-GFR reactor").

A method to manufacture ceramic tube for fuel element shell is known in the art (Patent RU 2575863, IPC G21C 3/00, publ. 20 Feb. 2016). The invention relates to methods for producing high-temperature silicon-carbide composite materials that may be used in the production of ceramic tubes for fuel claddings and other fuel assembly units. The method for manufacturing a ceramic tube for a fuel cladding made of silicon carbide layers comprises the following steps: a tubular framework is formed from fiber having β-SiC structure, impregnated with a ceramic-forming precursor in an inert gas atmosphere, then subject to stepwise thermal treatment for producing a ceramic matrix, and a ceramic composite is formed in the process of final high-temperature thermal treatment.

A disadvantage of this invention is insufficient tightness and protection of the composite central load-bearing layer due to the lack of a gas-tight inner layer and a corrosion-resistant outer layer of monolithic stoichiometric beta-phase silicon carbide.

The closest prior art, which is taken as the prototype, is a multi-layered ceramic tube for use as cladding of a fuel rod used in a nuclear power reactor and a method of making same (Patent US 2009032178, IPC B05D 7/22, B29C 53/58, publ. 5 Feb. 2009), having an inner layer formed of high-purity beta phase stoichiometric silicon carbide, a central composite layer formed of continuous beta phase stoichiometric silicon carbide fibers, and an outer layer of silicon carbide.

The first embodiment of the method according to patent US 2009032178. The method of making a multi-layered ceramic tube for use in a cladding of a fuel rod in a nuclear reactor comprises: a) forming an inner layer of monolithic silicon carbide; b) forming a central layer of silicon carbide fibers surrounded by a silicon carbide matrix over said inner layer; and c) forming an outer layer of monolithic silicon carbide over said central layer; the inner layer being formed of beta phase stoichiometric silicon carbide. The inner layer is formed by chemical vapor deposition. The central layer is formed by winding at least one fiber tow of beta phase stoichiometric silicon carbide fibers around said inner layer and impregnating said fiber tow with a beta phase stoichiometric silicon carbide matrix. The outer layer is formed of monolithic beta phase stoichiometric silicon carbide by chemical vapor deposition. The inner layer, the central layer and the outer layer all consist of beta phase stoichiometric silicon carbide.

The second embodiment of the method according to Patent US 2009032178. The method of making a multi-layered ceramic tube for use in a cladding of a fuel rod in a nuclear reactor comprises: a) forming an inner monolithic tube of beta phase stoichiometric silicon carbide by chemical vapor deposition; b) winding at least one fiber tow of beta phase stoichiometric silicon carbide fibers around said inner layer and impregnating said fiber tow with a beta phase stoichiometric silicon carbide matrix to form a central layer; and c) forming an outer layer of monolithic beta phase stoichiometric silicon carbide over said central layer by chemical vapor deposition. Further, the method may comprise the step of winding said tow at an angle of from about +45 to −45 degrees relative to the axis of said tube. The method may also comprise the step of winding multiple tows around said inner layer to form said central layer. The method may comprise the step of winding each of said tows so it overlaps the previous reverse direction tow. The method comprises impregnating said central layer with beta phase stoichiometric silicon carbide by chemical vapor infiltration. The method comprises coating said central layer with an outer layer having a thickness of less than 0.127 mm. Said inner tube is formed by joining together a plurality of tube sections, and forming said central and outer layers over said joined tube sections. The method may further comprise forming spacer tabs on the outer surface of said tube.

The third embodiment of the method according to Patent US 2009032178. The method of making a multi-layered ceramic tube for use in a cladding of a fuel rod in a nuclear reactor comprises: a) forming an inner monolithic tube of beta phase stoichiometric silicon carbide by chemical vapor deposition; b) winding a plurality of fiber tows of beta phase stoichiometric silicon carbide fibers around said inner layer so that each tow overlaps the previous tow in the reverse direction, and impregnating said fiber tows with a beta phase stoichiometric silicon carbide matrix to form a central layer; and c) forming an outer layer of monolithic beta phase stoichiometric silicon carbide over said central layer by chemical vapor deposition. The method may comprise the step of winding each tow at an angle of from about +45 to −45 degrees relative to the axis of said tube. Said inner tube is formed by joining together a plurality of tube sections, and forming said central and outer layers over said joined tube sections. The method may further comprise forming spacer tabs on the outer surface of said tube. Said fiber tows are coated with an interface SiC-coating containing an inner carbon sub-layer. Said fibers are impregnated by chemical vapor infiltration after being coated with said interface SiC-coating. To form nanocrystalline cubic silicon carbide a gas mixture is used that contains silicon and carbon hydrides and chlorides.

Disadvantages of this invention are:
1) insufficient mechanical strength properties due to limited resistance to arising stresses, and non-uniform distribution of loads on a composite as a whole due to forming the central layer by winding fibers of beta phase stoichiometric silicon carbide around the inner layer, rather than by their braiding;
2) hazard to the environment due to generation of ecologically hazardous hydrogen chloride gas owing to the use of a gas mixture comprising chlorine and hydrogen;
3) lack of data on methods used for sealing ends of fuel rod tubes.

BRIEF SUMMARY OF THE INVENTION

The object of the present invention is to produce a ceramic tube for a cladding of a fuel element by a practically feasible and ecologically-friendly method.

The technical effects of the proposed invention are: improved mechanical strength properties of the final product, i.e. a ceramic multilayered tube for a cladding of a fuel element; improved neutron-physical characteristics of the product; provision of a hermetically sealed and protected load-bearing central layer in the composite, safety for the environment, provision of hermetically sealed ends of the fuel element tube.

The essence of the proposed invention is that the method for producing a ceramic multilayered tube for a cladding of a fuel element for use in a nuclear power plant comprises successive formation of layers. In particular, an inner monolithic layer having a thickness of 250-500 μm is formed from crystals of beta phase stoichiometric silicon carbide on a carbon substrate in the form of a rod by chemical methylsilane vapor deposition in a CVD reactor at operating temperature of 660-730 degrees C. and pressure of 50-100 Pa for 60-100 hours; gaseous argon is fed to the reactor when it is heated from room to operating temperature and is cooled from operating to room temperature. A central composite layer having a thickness of 300-500 μm is formed over the inner monolithic layer, for which continuous stoichiometric fibers of beta phase silicon carbide having a diameter of 10-15 μm are twisted into tows of 500-1500 fibers, the tows are transported to a braiding machine for biaxial or triaxial braiding, and a reinforcing thread framework in the form of a long-length cord is formed; the long-length cord is arranged over the inner monolithic layer disposed on the carbon substrate, and its ends are fixed; a pyrocarbon interface coating is built up on the long-length cord to a thickness of 100-200 nm by chemical methane vapor deposition in a CVD reactor at a temperature of 1000-1050 degrees C., feeding gaseous argon when heating the CVD reactor from room to operating temperature; then, a matrix is formed from crystals of beta phase stoichiometric silicon carbide inside the long-length cord by chemical methylsilane vapor deposition in a CVD reactor at a temperature of 660-730 degrees C., feeding gaseous argon when cooling the CVD reactor from operating to room temperature. A protective outer monolithic layer having the thickness of 100 μm is formed from crystals of beta phase stoichiometric silicon carbide on the central composite layer by chemical methylsilane vapor deposition in a CVD reactor at an operating temperature of 660-730 degrees C. and pressure of 50-100 Pa for 10-20 hours, gaseous argon is fed to the reactor when it is heated from room to operating temperature and is cooled from operating to room temperature. Then, a carbon substrate is removed from the produced semi-finished product. The carbon substrate may be removed, in particular, by oxidation in air at a temperature of 700-1000 degrees C. A graphite rod having diameter of 7.7 mm of the GMZ grade or MG, or MPG grade composed of fine-grained graphite may be used as the carbon substrate. In order to remove sorption moisture from the graphite rod, it is wiped with a dry cotton fabric, placed in a vacuum furnace, heated to the temperature of 100 degrees C. for 3 hours; then, the vacuum furnace is switched off, and the rod is held at the argon pressure of 0.3 Pa for 21 hours and removed from the vacuum furnace. In order to form the inner monolithic layer, gaseous argon is fed at the flowrate of 1 L/h, and gaseous methylsilane is fed at the flowrate of 1 L/h. Tows may be braided in a ShP-48 braiding machine. Tows may be transported for biaxial braiding with the fiber orientation of 45 degrees×45 degrees and the braiding density of 3 by 1 cm, or for triaxial braiding with the fiber orientation of 45 degrees×45 degrees×0 degrees with four axial fibers and braiding density of 2.75 by 1 cm, or for triaxial braiding with the fiber orientation of 45 degrees×45 degrees×0 degrees with eight axial fibers and braiding density of 2.5 by 1 cm. To build up a pyrocarbon interface coating when forming the central composite layer, gaseous argon is fed at the flowrate of 1 L/h, gaseous methane—at the flowrate of 3 L/h, and gaseous methylsilane—at the flowrate of 1 L/h. To form the protective outer monolithic layer, gaseous argon is fed at the flowrate of 1 L/h, and gaseous methylsilane is fed at the flowrate of 1 L/h.

BRIEF DESCRIPTION OF THE SEVERAL VIEWS OF THE DRAWINGS

The invention is illustrated with the following graphic materials.

DETAILED DESCRIPTION OF THE INVENTION

According to this invention, a fuel element of a nuclear power plant comprises, in particular, a ceramic composite multilayered tube, which is sealed on both sides with end plugs and which comprises an inner layer of monolithic silicon carbide, a central layer being a composite of interwoven reinforcing fibers of silicon carbide surrounded by a pyrocarbon interface coating and impregnated with a silicon carbide matrix, and an outer layer of monolithic silicon carbide. All the layers and elements of the tube, including fiber, are composed of beta phase stoichiometric silicon carbide crystals. Plugs, which are used in this invention, are produced by hot pressing from powders based on beta phase silicon carbide with the use of sintering additives in the form of powdered oxides of aluminium and yttrium. All the materials are selected so that neutron-physical characteristics of final products are not compromised.

Figure 1:
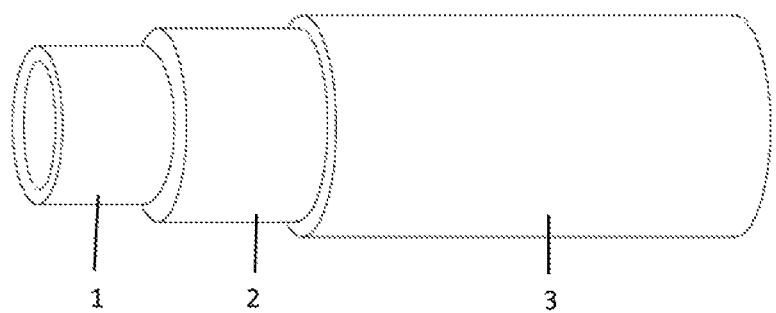
FIG. 1 shows a schematic view of a multilayered ceramic composite tube, where: 1—inner monolithic layer, 2—central composite layer, 3—protective outer monolithic layer.

The three layers of the multilayered ceramic tube (see FIG. 1) are: the inner monolithic layer 1, the central composite layer 2 and the protective outer monolithic layer 3.

The inner monolithic layer 1 is high-purity beta phase stoichiometric silicon carbide formed by chemical methylsilane vapor deposition. Since this layer practically has no porosity, it serves as a barrier for containment of gas forming as a result of fuel fission, thus preventing cladding radioactive gases from escaping into a coolant.

The central composite layer 2 is composed of reinforcing continuous coreless beta phase stoichiometric silicon carbide fibers that are tightly applied over the inner monolithic layer 1, covered with a pyrocarbon interface coating and impregnated with a silicon carbide matrix. This layer serves as the load-bearing layer, it provides resistance to formation of cracks and other defects capable of leading to destruction under the influence of mechanical loads on the composite. The braided reinforcing framework is provided for counteracting mechanical and thermal loads arising during normal operation of a nuclear reactor or in possible emergencies. The interface coating of pyrolytic carbon serves for ensuring flexibility of tows in the braided fibrous framework in a matrix that is required for load distribution during deformation. The presence of this interface coating on high-strength stoichiometric fibers surrounded with a dense matrix enables the central composite layer 2 to withstand very high deformations necessary for operation in emergency conditions of a nuclear reactor.

The protective outer monolithic layer 3 of the multilayered composite is high-purity beta phase stoichiometric silicon carbide formed by chemical methylsilane vapor deposition. It serves as a protective barrier against exposure and is intended to ensure that a nuclear reactor coolant (water, steam, gas or liquid metal) does not damage the central composite central 2, which is a load-bearing layer, withy mechanical and chemical actions or corrosion.

Figures 2, 3, 4:
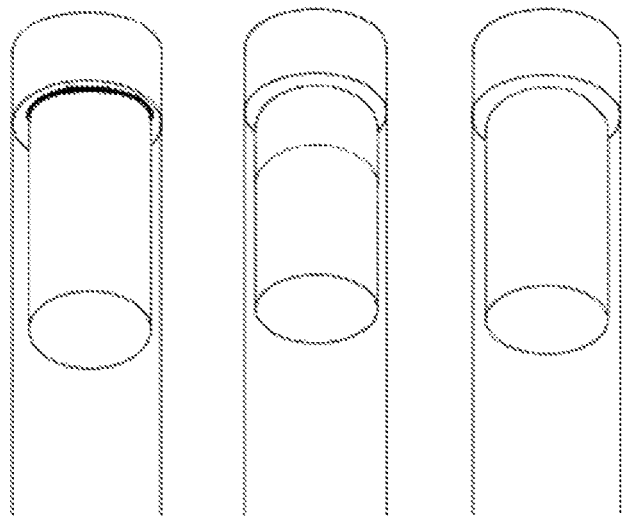
FIGS. 2-4 show schematic views of variants of plug structures for sealing fuel claddings based on silicon carbide.

The ends of multilayered tubes for fuel claddings made of a composite based on silicon carbide are hermetically sealed with plugs that are fabricated by hot pressing from a mixture of powders based on silicon carbide. FIGS. 2-4 show the variants of plug structures developed for sealing fuel claddings based on silicon carbide. For the sake of clearness, the fuel claddings are conditionally shown as transparent in these Figures.

FIG. 2 shows a plug made as a single whole of two parts in the form of two coaxial cylinders having different diameters; the diameter of the first cylindrical part is made equal to 7.7 mm, and the diameter of the second cylindrical part is made equal to an outer diameter of the cladding. The cladding end is made straight. The first cylindrical part is configured to be arranged inside the cladding, and the second cylindrical part is configured to be fitted to the end of the cladding outside of it.

FIG. 3 shows a plug made as a single whole of three parts in the form of three coaxial cylinders having different diameters; the diameter of the first cylindrical part is made equal to 7.5 mm, the diameter of the second cylindrical part is made equal to 7.7 mm, and the diameter of the third cylindrical part is made equal to an outer diameter of the cladding. The cladding end is made straight. The first and second cylindrical parts are configured to be arranged inside the cladding, and the third cylindrical part is configured to be fitted to the end of the cladding outside of it.

FIG. 4 shows a plug made as a single whole of two parts in the form of two coaxial cylinders having different diameters; the diameter of the first cylindrical part is made equal to 7.5 mm, and the diameter of the second cylindrical part is made equal to an outer diameter of the cladding. The cladding end is made straight. The first cylindrical part is configured to be arranged inside the cladding, and the second cylindrical part is configured to be fitted to the end of the cladding outside of it.

The plugs are arranged coaxially to the cladding and are connected to it by brazing with a high-temperature titanium- or zirconium-based braze for silicon carbide, the braze is doped with various elements to lower its melting temperature and improve brazing characteristics.

The end plugs serve for sealing tube for fuel cladding after loading a fuel. Similarly to the ceramic composite cladding tube, the end plugs should provide tightness, effective transfer of heat from fuel to coolant, have required mechanical strength, resistance to crack formation and corrosion. Also, end plugs should have thermal and physical properties closely similar to those of a tube-cladding, to preclude appearance of inner stresses in all possible operating modes which may lead to hermeticity failure and escape of cladding radioactive gases into a coolant.

The method for producing a sealed composite cladding tube of a fuel element comprises steps of successively forming the layers, i.e. the inner monolithic layer 1, the central composite layer 2 and the protective outer monolithic layer 3.

The inner monolithic layer 1 is formed with a thickness of 250-500 μm from crystals of beta phase stoichiometric silicon carbide on a carbon substrate in the form of a rod by chemical methylsilane vapor deposition in a sealed tubular vapor deposition hot-wall reactor (hereinafter, a CVD reactor) at an operating temperature of 660-730 degrees C. and pressure of 50-100 Pa for 60-100 hours. Gaseous argon is fed to the reactor when it is heated from room to operating temperature and is cooled from operating to room temperature. Argon is fed for the purposes of substituting an air medium when the CVD reactor is heated and protecting produced samples against oxidation when they are cooled in the reactor. Gaseous argon is fed at the flowrate of 1 L/h. Gaseous methylsilane is fed at the flowrate of 1 L/h.

The central composite layer 2 is formed with a thickness of 300-500 μm over the inner monolithic layer; to do this, continuous beta phase stoichiometric silicon carbide fibers having a diameter of 10-15 μm are twisted into tows of 500-1500 fibers. In order to impart high mechanical strength to a SiC-based composite, it is necessary to use continuous silicon carbide fibers, primarily coreless fibers, due to their low module of elasticity, small diameter and high bend angle.

The tows are transported for biaxial or triaxial braiding to a braiding machine, and a reinforcing thread framework is formed in the form of a long-length cord; the long-length cord is slipped on the inner monolithic layer 1, which is disposed on the carbon substrate, and its ends are fixed. A pyrocarbon interface coating with a thickness of 100-200 nm is built up on the long-length cord by chemical methane vapor deposition in the CVD reactor at a temperature of 1000-1050 degrees C. and pressure of 100-200 Pa for 1.5-2 hours.

Gaseous argon is fed for substituting an air medium when the CVD reactor is heated from room to operating temperature, and then a matrix consisting of crystals of beta phase stoichiometric silicon carbide is formed inside the long-length cord by chemical methylsilane vapor deposition in the CVD reactor at a temperature of 660-730 degrees C. and pressure of 50-100 Pa for 5-10 hours; and gaseous argon is fed when the CVD reactor is cooled from operating to room temperature. In order to build up a pyrocarbon interface coating, gaseous argon is fed at the flowrate of 1 L/h, and gaseous methane is fed at the flowrate of 3 L/h. To form a matrix from crystals of beta phase stoichiometric silicon carbide, gaseous methylsilane is fed at the flowrate of 1 L/h. Argon is fed for the purpose of protecting produced samples against oxidation when they are cooled in the CVD reactor.

Tows may be braided, in particular, in a ShP-48 braiding machine. Tows may be transported for biaxial braiding with the fiber orientation of 45 degrees×45 degrees and braiding density of 3 by 1 cm. Tows may be transported for triaxial braiding with the fiber orientation of 45 degrees×45 degrees×0 degrees, four axial fibers and braiding density of 2.75 by 1 cm. Tows may be transported for triaxial braiding with the fiber orientation of 45 degrees×45 degrees×0 degrees, eight axial fibers and braiding density of 2.5 by 1 cm.

Figure 6:
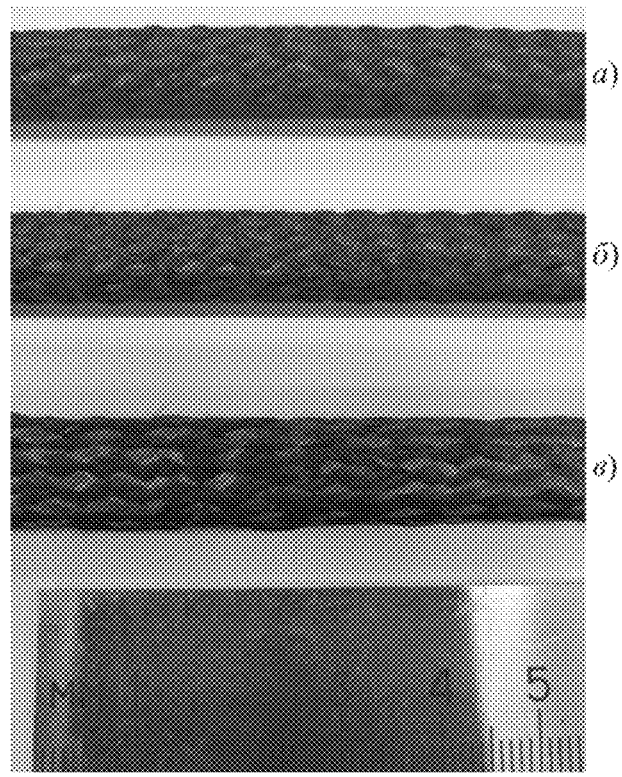
FIG. 6 shows elevation views of continuous stoichiometric fiber of beta phase silicon carbide in the form of a braided long-length cord, where: a) a biaxially braided cord with fiber orientation of 45 degrees×45 degrees and braiding density of 3 by 1 cm; b) a triaxially braided cord with fiber orientation of 45 degrees×45 degrees×0 degrees, four axial fibers and braiding density of 2.75 by 1 cm; c) a triaxially braided cord with fiber orientation of 45 degrees×45 degrees×0 degrees, eight axial fibers and braiding density of 2.5 by 1 cm.

FIG. 6 shows continuous stoichiometric fiber of beta phase silicon carbide in the form of a braided long-length cord, where:

a) a biaxially braided cord with the fiber orientation of 45 degrees×45 degrees and braiding density of 3 by 1 cm;

b) a triaxially braided cord with the fiber orientation of 45 degrees×45 degrees×0 degrees, four axial fibers and braiding density of 2.75 by 1 cm;

c) a triaxially braided cord with the fiber orientation of 45 degrees×45 degrees×0 degrees, eight axial fibers and braiding density of 2.5 by 1 cm.

Figure 7:
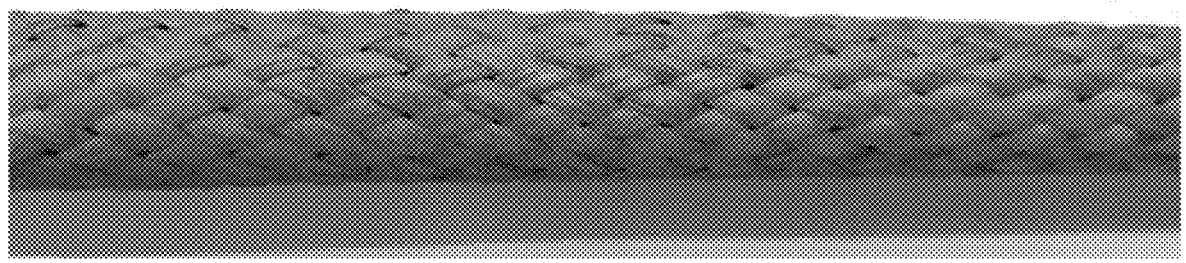
FIG. 7 shows an elevation view of a fibrous framework produced by biaxial braiding of a cord, having the orientation of continuous stoichiometric silicon carbide fiber of 45 degrees×45 degrees, and arranged on a graphite rod with an applied gas-tight inner monolithic layer of a multilayered ceramic tube.

FIG. 7 shows a fibrous framework produced by biaxial braiding of a cord, having the orientation of continuous stoichiometric silicon carbide fiber equal to 45 degrees×45 degrees and arranged on a graphite rod with an applied inner monolithic layer 1 of a multilayered ceramic tube.

The protective outer monolithic layer 3 is formed with the thickness of 100 μm from crystals of beta phase stoichiometric silicon carbide over the central composite layer 2 by chemical methylsilane vapor deposition in a CVD reactor at an operating temperature of 660-730 degrees C. and pressure of 50-100 Pa for 10-20 hours. Gaseous argon is fed for substituting an air medium when the CVD reactor is heated from room to operating temperature and cooled from operating to room temperature. Argon is fed for the purpose of protecting produced samples against oxidation when they are cooled in the CVD reactor. Gaseous argon is fed at the flowrate of 1 L/h. Gaseous methylsilane is fed at the flowrate of 1 L/h.

Then, after all the three layers 1, 2, 3 are formed, a carbon substrate is removed from the fabricated semi-finished product. The substrate is removed by oxidation in the result of heating the graphite rod in air to a temperature of 700-1000 degrees C.

A graphite rod of the GMZ, MG or MPG grade, which has the diameter of 7.7 mm, may be used as a carbon substrate. Preliminarily, in order to remove sorption moisture from the graphite rod, it is wiped with a dry cotton fabric, placed in a vacuum furnace, heated in an argon atmosphere to the temperature of 100 degrees C. at the pressure of 0.3 Pa, and held at the temperature of 100 degrees C. for 3 hours; then, the vacuum furnace is switched off, the rod is held at the argon pressure of 0.3 Pa for 21 hours and removed from the vacuum furnace.

Below, exemplary embodiments of the method for producing a ceramic multilayered tube for cladding of a fuel element for a nuclear power plant are described.

EXAMPLE 1

The inner monolithic layer 1 being gas-tight, having the thickness of 500 μm, consisting of crystals of beta phase stoichiometric silicon carbide was formed by chemical methylsilane vapor deposition onto a carbon substrate made in the form of a rod.

Graphite rods of GMZ grade having the diameter of 7.7 mm were used as the substrate. In order to remove sorption moisture from the graphite rods, they were wiped with a dry cotton fabric, placed in a vacuum furnace, heated in an argon atmosphere to the temperature of 100 degrees C. at the pressure of 0.3 Pa, and held at this temperature for 3 hours. Then, after switching off the vacuum furnace, the sample rods were held at the argon pressure of 0.3 Pa for about 21 hours, removed and loaded into a CVD reactor.

The process of depositing crystalline beta phase silicon carbide was performed in a sealed tubular hot-wall reactor having a vertical construction; gaseous methylsilane, when passing through the reactor, was decomposed on the heated substrate, which resulted in building up dense layers of silicon carbide crystals.

In the initial step, after arranging the prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature. The argon flowrate was set to 1 L/h.

When the chamber of the CVD reactor was heated to the temperature of 730 degrees C., the feed of argon was stopped, and feed of methylsilane to the reactor was started; from that time, the period of forming a crystalline silicon carbide was counted. The methylsilane flowrate in the process was controlled to be at the level of 1 L/h. The pressure in the chamber of the CVD reactor was maintained at 100 Pa.

Upon expiration of 100 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the reactor, the vacuum pump was switched off, the feed of argon was stopped, and the samples were unloaded from the CVD reactor.

The central composite layer 2 with the thickness of 300 μm was formed successively, in several steps.

A reinforcing thread framework was fabricated in the form of a long-length cord by biaxial braiding of continuous stoichiometric beta phase silicon carbide fibers; then, a pyrocarbon interface coating with the thickness of 100 nm was applied onto the long-length cord by methane vapor deposition; and then a matrix was formed within the braided thread framework, which was composed of crystals of beta phase stoichiometric silicon carbide, by methylsilane vapor deposition.

Figure 5:
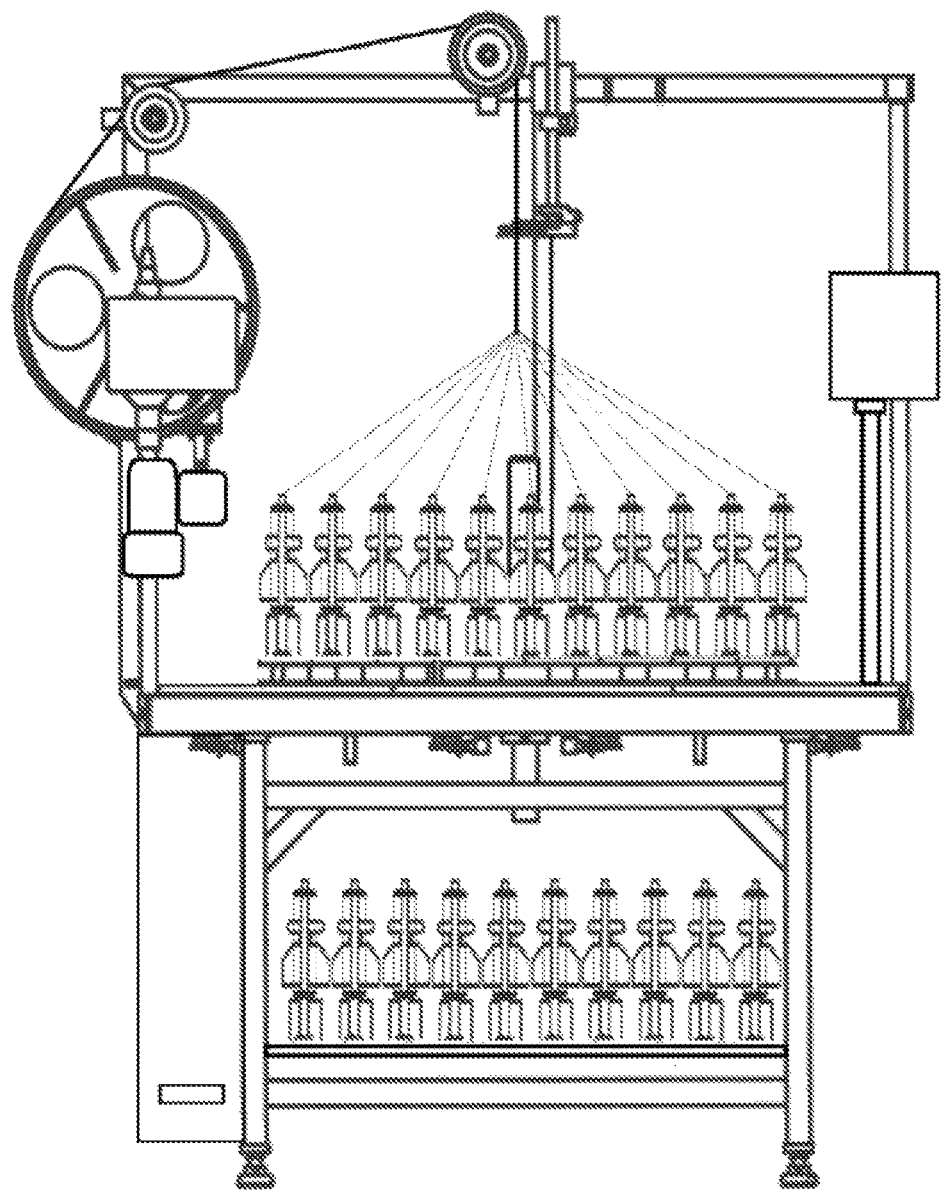
FIG. 5 shows a general perspective view of a ShP-48 braiding machine.

The central composite layer 2 was produced by preliminarily twisting (assembling) continuous silicon carbide fibers having diameter of 10-15 μm into tows, each comprising 1500 fibers. The produced tows were transported to braiding for forming a reinforcing semi-finished product in the form of a long-length cord. The cylindrically-shaped long-length cord was formed in the ShP-48 braiding machine shown in FIG. 5 by biaxial braiding.

Before starting work at the ShP-48 braiding machine, continuous stoichiometric silicon carbide fiber was wound on VPRA-80 working bobbins of the VPR-125 spindle forming a part of the braiding machine.

Only spindles of the upper movable plate of the braiding machine, in the quantity of 24, were used for forming a biaxially braided cord with the fiber orientation of 45 degrees×45 degrees.

As a result, a batch of long-length cords was formed with the braiding density of 3 by 1 cm, as shown in FIG. 6(a).

After forming the braided long-length cord, formation of the fibrous framework was started. To do this, a long-length cord with biaxial arrangement of continuous stoichiometric beta phase silicon carbide fiber was placed over a graphite rod on which surface the gas-tight inner monolithic layer 1 of a composite with the thickness of 500 μm was formed composed of crystals of beta phase stoichiometric silicon carbide. To fix the long-length cord on the rod and prevent its ends on both sides from loosening, the cord was fixed with a painter's tape.

Then, the fibrous framework arranged on the graphite rod with the inner monolithic layer 1 of the multilayered ceramic tube was covered with a pyrocarbon interface coating with the thickness of 100 nm by methane vapor deposition, followed by formation of a matrix within the braided thread framework.

The matrix compaction process was carried out by chemical methylsilane vapor deposition, which enables to avoid delamination and subsequent destruction of the composite and provides uniform swelling during irradiation and uniform load distribution.

The process of applying a pyrocarbon interface coating, followed by formation of a matrix within the braided thread framework, was performed successively in a sealed tubular hot-wall reactor having a vertical construction. In order to form the pyrocarbon interface coating, gaseous methane was fed into the CVD reactor where it decomposed on the heated substrate, which resulted in building up dense layers of pyrocarbon. In order to form a matrix from crystals of beta phase stoichiometric silicon carbide, gaseous methylsilane was fed into the CVD reactor where it decomposed on the heated substrate, which resulted in building up dense layers of silicon carbide crystals.

In the initial step, after arranging the prepared semi-finished product in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 1000 degrees C. The argon flowrate was set to 1 L/h.

When the chamber of the CVD reactor was heated to the temperature of 1000 degrees C., the feed of argon was stopped, and feed of methane to the reactor was started; from that time, the period of forming a pyrocarbon layer was counted. The methane flowrate in the process was controlled to be at the level of 3 L/h.

Upon expiration of 1.5 hours, the feed of methane was stopped; the feed of argon was started, and the CVD reactor was cooled to 730 degrees C. After the temperature was corrected, the feed of argon was stopped, and the feed of methylsilane to the reactor was started; from that time, the period of forming a matrix of crystalline silicon carbide was counted. The methylsilane flowrate in the course of the process was controlled to be at the level of 1 L/h.

Upon expiration of 5 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the CVD reactor, the vacuum pump was switched off, the feed of argon was stopped, and the samples were unloaded from the reactor.

The protective outer monolithic layer 3, which was made gas-tight, had the thickness of 100 μm and was composed of crystals of beta phase stoichiometric silicon carbide, was formed by methylsilane vapor deposition onto a heated substrate. A carbon rod with the already applied inner monolithic layer 1 and central composite layer 2 was used as the substrate.

The process of depositing crystalline beta phase silicon carbide was carried out in a sealed tubular hot-wall reactor having a vertical construction; gaseous methylsilane, while passing through the reactor, decomposed on the heated substrate, which resulted in building up dense layers of silicon carbide crystals. The pressure was 100 Pa.

In the initial step, after arranging a prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 730 degrees C. The argon flowrate was set to 1 L/h. When the chamber of the CVD reactor was heated to 730 degrees C., the feed of argon was stopped, and the feed of methylsilane to the reactor was started; from that time, the period of forming a crystalline silicon carbide layer was started. The flowrate of methylsilane was controlled to be at the level of 1 L/h during the whole process. Upon expiration of 10 hours, heating of the CVD reactor was switched off, the feed of methylsilane was stopped, and the feed of argon was started. The flowrate of argon in the step of cooling the CVD reactor was controlled to be at the level of 1 L/h, and the feed was continued until the reactor was cooled to room temperature.

Upon cooling the CVD reactor, the vacuum pump was switched off, the feed of argon was stopped, and the samples were unloaded from the CVD reactor.

After all the three layers 1, 2, 3 were formed, a carbon substrate made in the form of a rod was removed. The substrate was removed by oxidation as a result of heating the graphite rod in air to a temperature of 700 degrees C.

The produced samples were transported for studying their mechanical properties, the following parameters being checked: strength, porosity, crystallite sizes and phase composition. Tensile strength of the samples was 340 MPa, closed porosity—5.7%, crystallite size—50 μm, phase composition—β-SiC.

EXAMPLE 2

The inner monolithic layer 1 being gas-tight, having the thickness of 350 μm, consisting of crystals of beta phase stoichiometric silicon carbide was formed by chemical methylsilane vapor deposition onto a carbon substrate made in the form of a rod.

Graphite rods having the diameter of 7.7 mm and made of fine-grained graphite of MG grade were used as the substrate. In order to remove sorption moisture from the graphite rods, they were wiped with a dry cotton fabric, placed in a vacuum furnace, heated in an argon atmosphere to the temperature of 100 degrees C. at the pressure of 0.3 Pa, and held at this temperature for 3 hours. Then, after switching off the vacuum furnace, the sample rods were held at the argon pressure of 0.3 Pa for about 21 hours, removed and loaded into a CVD reactor.

The process of depositing crystalline beta phase silicon carbide was performed in a sealed tubular hot-wall reactor having a vertical construction; gaseous methylsilane, when passing through the reactor, decomposed on the heated substrate, which resulted in building up dense layers of silicon carbide crystals.

In the initial step, after arranging the prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature. The argon flowrate was set to 1 L/h.

When the chamber of the CVD reactor was heated to the temperature of 700 degrees C., the feed of argon was stopped, and feed of methylsilane to the reactor was started; from that time, the period of forming a crystalline silicon carbide was counted. The methylsilane flowrate in the process was controlled to be at the level of 1 L/h. The pressure in the chamber of the CVD reactor was maintained at 80 Pa.

Upon expiration of 70 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the reactor, the vacuum pump was switched off, the feed of argon was stopped, and the samples were unloaded from the CVD reactor.

The central composite layer 2 with the thickness of 450 μm was formed successively, in several steps.

A reinforcing thread framework was fabricated in the form of a long-length cord by triaxial braiding of continuous stoichiometric beta phase silicon carbide fibers; then, a pyrocarbon interface coating with the thickness of 150 nm was applied onto the long-length cord by methane vapor deposition; and then a matrix was formed within the braided thread framework, which was composed of crystals of beta phase stoichiometric silicon carbide, by methylsilane vapor deposition.

The central composite layer 2 was produced by preliminarily twisting (assembling) continuous silicon carbide fibers having diameter of 10-15 μm into tows, each comprising 1000 fibers. The produced tows were transported to braiding for forming a reinforcing semi-finished product in the form of a long-length cord. The cylindrically-shaped long-length cord was formed in the ShP-48 braiding machine shown in FIG. 6 by triaxial braiding.

Before starting work at the ShP-48 braiding machine, continuous stoichiometric silicon carbide fiber was wound on VPRA-80 working bobbins of the VPR-125 spindle forming a part of the braiding machine.

When forming a triaxially braided cord with the fiber orientation of 45 degrees×45 degrees×0 degrees, four axial fibers are added; to do this, bobbins with wound silicon carbide fiber should be additionally arranged on spindles of the lower immovable plate of the braiding machine, as is shown in FIG. 6.

As a result, a batch of long-length cords was formed with the braiding density of 2.75 by 1 cm, as shown in FIG. 6(b).

After forming the braided long-length cord, formation of the fibrous framework was started. To do this, a long-length cord with triaxial arrangement of continuous stoichiometric beta phase silicon carbide fiber was placed over a graphite rod on which surface the gas-tight inner monolithic layer 1 of a composite with the thickness of 350 μm was formed that was composed of crystals of beta phase stoichiometric silicon carbide. To fix the long-length cord on the rod and prevent its ends on both sides from loosening, the cord was fixed with a painter's tape.

Then, the fibrous framework arranged on the graphite rod with the inner monolithic layer 11 of the multilayered ceramic tube was covered with a pyrocarbon interface coating with the thickness of 150 nm by methane vapor deposition, followed by formation of a matrix within the braided thread framework.

The matrix compaction process was carried out by chemical methylsilane vapor deposition, which enables to avoid delamination and subsequent destruction of the composite and provides uniform swelling during irradiation and uniform load distribution.

The process of applying a pyrocarbon interface coating, followed by formation of a matrix within the braided thread framework, was performed successively in a sealed tubular hot-wall reactor having a vertical construction. In order to form the pyrocarbon interface coating, gaseous methane was fed into the CVD reactor where it decomposed on the heated substrate, which resulted in building up dense layers of pyrocarbon. In order to form a matrix from crystals of beta phase stoichiometric silicon carbide, gaseous methylsilane was fed into the CVD reactor where it decomposed on the heated substrate, which resulted in building up dense layers of silicon carbide crystals.

In the initial step, after arranging the prepared semi-finished product in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 1000 degrees C. The argon flowrate was set to 1 L/h.

When the chamber of the CVD reactor was heated to the temperature of 1000 degrees C., the feed of argon was stopped, and feed of methane to the reactor was started; from that time, the period of forming a pyrocarbon layer was counted. The methane flowrate in the process was controlled to be at the level of 3 L/h.

Upon expiration of 2 hours, the feed of methane was stopped; the feed of argon was started, and the CVD reactor was cooled to 700 degrees C. After the temperature was corrected, the feed of argon was stopped, and the feed of methylsilane to the reactor was started; from that time, the period of forming a matrix of crystalline silicon carbide was counted. The methylsilane flowrate in the course of the process was controlled to be at the level of 1 L/h.

Upon expiration of 8 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the CVD reactor, the vacuum pump was switched off, the feed of argon was stopped, and the samples were unloaded from the reactor.

The protective outer monolithic layer 3, which was made gas-tight, had the thickness of 100 μm and was composed of crystals of beta phase stoichiometric silicon carbide, was formed by methylsilane vapor deposition onto a heated substrate. A carbon rod with the already applied inner monolithic layer 1 and central composite layer 2 was used as the substrate.

The process of depositing crystalline beta phase silicon carbide was carried out in a sealed tubular hot-wall reactor having a vertical construction; gaseous methylsilane, while passing through the reactor, decomposed on the heated substrate, which resulted in building up dense layers of silicon carbide crystals. The pressure was 80 Pa.

In the initial step, after arranging a prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 700 degrees C. The argon flowrate was set to 1 L/h. When the chamber of the CVD reactor was heated to 700 degrees C., the feed of argon was stopped, and the feed of methylsilane to the reactor was started; from that time, the period of forming a crystalline silicon carbide layer was started. The flowrate of methylsilane was controlled to be at the level of 1 L/h during the whole process. Upon expiration of 15 hours, heating of the CVD reactor was switched off, the feed of methylsilane was stopped, and the feed of argon was started. The flowrate of argon in the step of cooling the CVD reactor was controlled to be at the level of 1 L/h, and the feed was continued until the reactor was cooled to room temperature.

Upon cooling the CVD reactor, the vacuum pump was switched off, the feed of argon was stopped, and the samples were unloaded from the CVD reactor.

After all the three layers 1, 2, 3 were formed, a carbon substrate made in the form of a rod was removed. The substrate was removed by oxidation as a result of heating the graphite rod in air to a temperature of 800 degrees C.

The produced samples were transported for studying their mechanical properties, the following parameters being checked: strength, porosity, crystallite sizes and phase composition. Tensile strength of the samples was 342 MPa, closed porosity—5.4%, crystallite size—32 μm, phase composition—β-SiC.

EXAMPLE 3

The inner monolithic layer 1 being gas-tight, having the thickness of 250 μm, consisting of crystals of beta phase stoichiometric silicon carbide was formed by chemical methylsilane vapor deposition onto a carbon substrate made in the form of a rod.

Graphite rods having the diameter of 7.7 mm and made of fine-grained graphite of MPG grade were used as the substrate. In order to remove sorption moisture from the graphite rods, they were wiped with a dry cotton fabric, placed in a vacuum furnace, heated in an argon atmosphere to the temperature of 100 degrees C. at the pressure of 0.3 Pa, and held at this temperature for 3 hours. Then, after switching off the vacuum furnace, the sample rods were held at the argon pressure of 0.3 Pa for about 21 hours, removed and loaded into a CVD reactor.

The process of depositing crystalline beta phase silicon carbide was performed in a sealed tubular hot-wall reactor having a vertical construction; gaseous methylsilane, when passing through the reactor, decomposed on the heated substrate, which resulted in building up dense layers of silicon carbide crystals.

In the initial step, after arranging the prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature. The argon flowrate was set to 1 L/h.

When the chamber of the CVD reactor was heated to the temperature of 660 degrees C., the feed of argon was stopped, and feed of methylsilane to the reactor was started; from that time, the period of forming a crystalline silicon carbide was counted. The methylsilane flowrate in the process was controlled to be at the level of 1 L/h. The pressure in the chamber of the CVD reactor was maintained at 50 Pa.

Upon expiration of 60 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the reactor, the vacuum pump was switched off, the feed of argon was stopped, and the samples were unloaded from the CVD reactor.

The central composite layer 2 with the thickness of 500 μm was formed successively, in several steps.

A reinforcing thread framework was fabricated in the form of a long-length cord by triaxial braiding of continuous stoichiometric beta phase silicon carbide fibers; then, a pyrocarbon interface coating with the thickness of 200 nm was applied onto the long-length cord by methane vapor deposition; and then a matrix was formed within the braided thread framework, which was composed of crystals of beta phase stoichiometric silicon carbide, by methylsilane vapor deposition.

The central composite layer 2 was produced by preliminarily twisting (assembling) continuous silicon carbide fibers having diameter of 10-15 μm into tows, each comprising 500 fibers. The produced tows were transported to braiding for forming a reinforcing semi-finished product in the form of a long-length cord. The cylindrically-shaped long-length cord was formed in the ShP-48 braiding machine shown in FIG. 6 by triaxial braiding.

Before starting work at the ShP-48 braiding machine, continuous stoichiometric silicon carbide fiber was wound on VPRA-80 working bobbins of the VPR-125 spindle forming a part of the braiding machine.

When forming a triaxially braided cord with the fiber orientation of 45 degrees×45 degrees×0 degrees, eight axial fibers are added; to do this, bobbins with wound silicon carbide fiber should be additionally arranged on spindles of the lower immovable plate of the braiding machine.

As a result, a batch of long-length cords was formed with the braiding density of 2.5 by 1 cm, as shown in FIG. 6(*c*).

After forming the braided long-length cord, formation of the fibrous framework was started. To do this, a long-length cord with triaxial arrangement of continuous stoichiometric beta phase silicon carbide fiber was placed over a graphite rod on which surface the gas-tight inner monolithic layer 1 of a composite with the thickness of 250 μm was formed that was composed of crystals of beta phase stoichiometric silicon carbide. To fix the long-length cord on the rod and prevent its ends on both sides from loosening, the cord was fixed with a painter's tape.

Then, the fibrous framework arranged on the graphite rod with the inner monolithic layer 1 of the multilayered ceramic tube was covered with a pyrocarbon interface coating with the thickness of 200 nm by methane vapor deposition, followed by formation of a matrix within the braided thread framework.

The matrix compaction process was carried out by chemical methylsilane vapor deposition, which enables to avoid delamination and subsequent destruction of the composite and provides uniform swelling during irradiation and uniform load distribution.

The process of applying a pyrocarbon interface coating, followed by formation of a matrix within the braided thread framework, was performed successively in a sealed tubular hot-wall reactor having a vertical construction. In order to form the pyrocarbon interface coating, gaseous methane was fed into the CVD reactor where it decomposed on the heated substrate, which resulted in building up dense layers of pyrocarbon. In order to form a matrix from crystals of beta phase stoichiometric silicon carbide, gaseous methylsilane was fed into the CVD reactor where it decomposed on the heated substrate, which resulted in building up dense layers of silicon carbide crystals.

In the initial step, after arranging the prepared semi-finished product in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 1050 degrees C. The argon flowrate was set to 1 L/h.

When the chamber of the CVD reactor was heated to the temperature of 1050 degrees C., the feed of argon was stopped, and feed of methane to the reactor was started; from that time, the period of forming a pyrocarbon layer was counted. The methane flowrate in the process was controlled to be at the level of 3 L/h.

Upon expiration of 2 hours, the feed of methane was stopped; the feed of argon was started, and the CVD reactor was cooled to 660 degrees C. After the temperature was corrected, the feed of argon was stopped, and the feed of methylsilane to the reactor was started; from that time, the period of forming a matrix of crystalline silicon carbide was counted. The methylsilane flowrate in the course of the process was controlled to be at the level of 1 L/h.

Upon expiration of 10 hours, heating of the CVD reactor was switched off; the feed of methylsilane was stopped; and the feed of argon was started. The argon flowrate in the step of cooling the CVD reactor was controlled to be at the level of 1 L/h until the reactor was cooled to room temperature. Upon cooling the CVD reactor, the vacuum pump was switched off, the feed of argon was stopped, and the samples were unloaded from the reactor.

The protective outer monolithic layer 3, which was made gas-tight, had the thickness of 100 μm and was composed of crystals of beta phase stoichiometric silicon carbide, was formed by methylsilane vapor deposition onto a heated substrate. A carbon rod with the already applied inner monolithic layer 1 and central composite layer 2 was used as the substrate.

The process of depositing crystalline beta phase silicon carbide was carried out in a sealed tubular hot-wall reactor having a vertical construction; gaseous methylsilane, while passing through the reactor, decomposed on the heated substrate, which resulted in building up dense layers of silicon carbide crystals. The pressure was 50 Pa.

In the initial step, after arranging a prepared substrate in the CVD reactor, the reactor was sealed, and heating was switched on. Air was pumped out of the chamber on its one side with the use of a vacuum pump, and, simultaneously, feed of argon was started on the other side of the CVD reactor, the argon circulation was maintained during the whole step of heating the CVD reactor to the operating temperature of 660 degrees C. The argon flowrate was set to 1 L/h. When the chamber of the CVD reactor was heated to 660 degrees C., the feed of argon was stopped, and the feed of methylsilane to the reactor was started; from that time, the period of forming a crystalline silicon carbide layer was started. The flowrate of methylsilane was controlled to be at the level of 1 L/h during the whole process. Upon expiration of 20 hours, heating of the CVD reactor was switched off, the feed of methylsilane was stopped, and the feed of argon was started. The flowrate of argon in the step of cooling the CVD reactor was controlled to be at the level of 1 L/h, and the feed was continued until the reactor was cooled to room temperature.

Upon cooling the CVD reactor, the vacuum pump was switched off, the feed of argon was stopped, and the samples were unloaded from the CVD reactor.

After all the three layers 1, 2, 3 were formed, a carbon substrate made in the form of a rod was removed. The substrate was removed by oxidation as a result of heating the graphite rod in air to a temperature of 1000°?.

The produced samples were transported for studying their mechanical properties, the following parameters being checked: strength, porosity, crystallite sizes and phase composition. Tensile strength of the samples was 350 MPa, closed porosity—5.2%, crystallite size—26 μm, phase composition—β-SiC.

End plugs, which are used for the cladding of the fuel element according to this invention, should have very similar thermal and physical properties, in order no inner stresses develop in all possible operating modes, which may result in hermeticity failure and escape of cladding radioactive gases into a coolant.

Below, an example is given on how the end plugs in use may be fabricated.

End plugs may be formed from a mixture of powders based on beta phase silicon carbide by the NITE (nano-powder infiltration and transient eutectic phase) method consisting in that β-SiC powders are preliminarily pressed in the presence of insignificant quantities of aluminum oxide $Al_2O_3$, yttrium oxide $Y_2O_3$ into the plug shape, followed by hot pressing at a temperature of 1800-1900 degrees C. and a pressure of 15-30 MPa for 2-3 hours.

Figure 8:
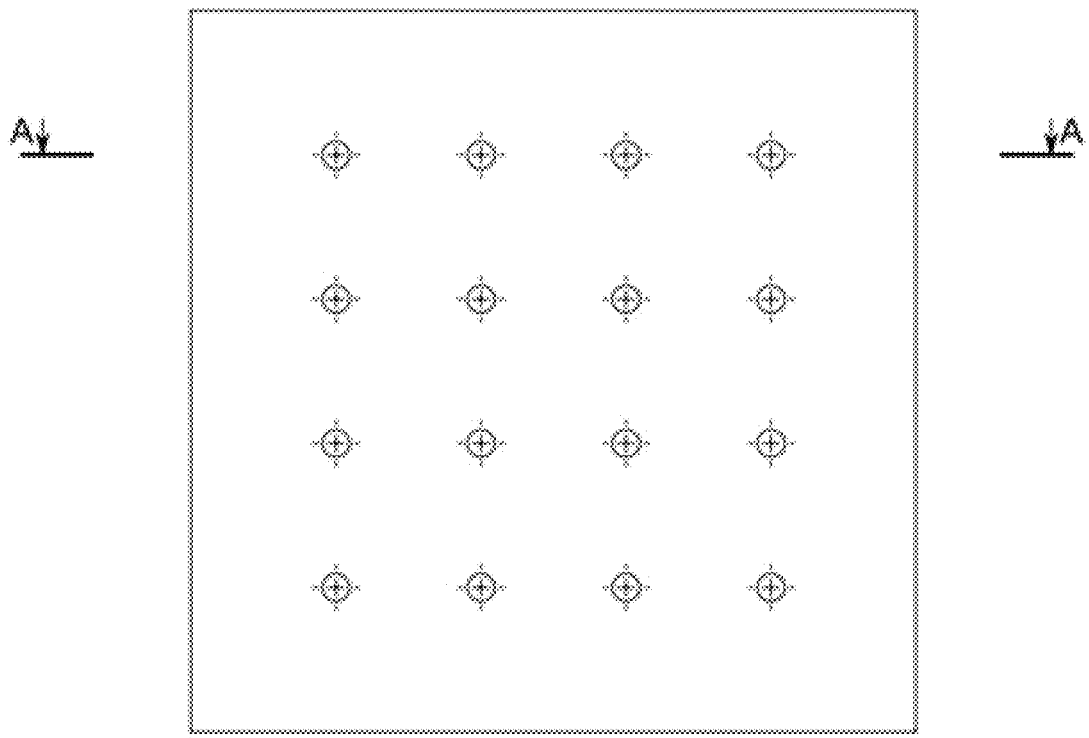
FIG. 8 shows a schematic view of a drawing of a die for pressing plugs, top view.
Figure 9:
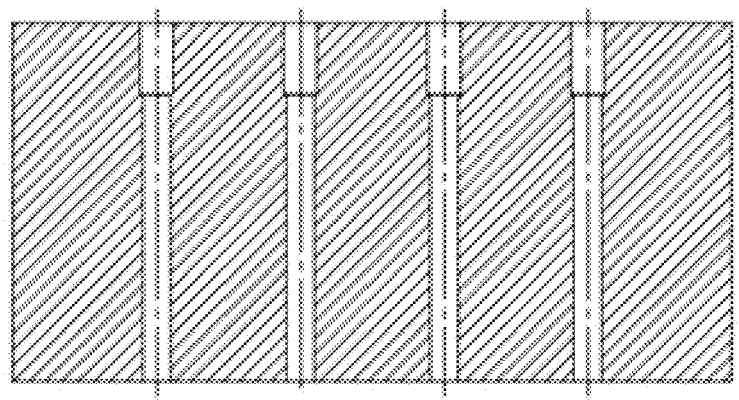
FIG. 9 shows a schematic view of a drawing of a die for pressing plugs, A-A Section.

In order to fabricate end plugs by hot pressing, a press die strength was calculated; as a result, PUS-1 graphite was selected, models were developed, and press dies were manufactured in the form of a parallelepiped with 12 equal, through cylindrical cells of the required shape and cylindrically-shaped punches. The die dimensions were 200×200×100 mm, the diameter of holes was 7.7 mm. FIG. 8 shows a drawing of a die for pressing plugs, FIG. 9 shows a drawing of a die for pressing plugs, A-A Section. In this example, the cell shape corresponds to the plug shown in FIG. 2.

To press end plugs, the powder mixture of the following composition was used:
SiC—from 85.0 to 94.0 wt %;
$(Al_2O_3+Y_2O_3)$—from 6 to 15 wt %;
$Al_2O_3/Y_2O_3$—from 6.6 to 1.5.

After preparing a mixture of the powders, a planetary ball mill was used for mixing them uniformly.

Before hot pressing, a die and punches were annealed in a vacuum compression unit for the purpose of removing moisture and dirt from the surfaces. To do this, the die and the punches were heated in a furnace to the temperature of 200 degrees C., annealed for 60 minutes and cooled to room temperature at a rate not higher than 50 degrees C./hour, held at room temperature for at least 12 hours; and a pressure in the furnace chamber was maintained at a level of not higher than 1 Pa during the entire process.

After cooling and unloading from the furnace, the die was prepared for pressing as follows:
punches were arranged in the lower portion of each cell of the die;
then, the powder mixture was filled into each cell of the die in the quantity of 2±0.002 grams;
then, the punches were arranged over the powder so that they closed each cell in the upper portion of the die.

The die with the powder thus prepared was placed into the furnace and held without heating at the pressure of ~1 Pa for 12 hours. Ceramic plugs were sintered in a vacuum compression unit in the temperature range from 1800 to 1900 degrees C. in an argon atmosphere at the pressure of about 0.1 MPa. The modes of sintering end plugs are shown in Table 1.

TABLE 1

Modes of sintering end plugs in furnace

| Step | Sintering step parameter | Sintering mode |
|---|---|---|
| 1 | Feed of the Ar inert gas into furnace and generation of pressure, Pa, in furnace chamber | 100 000 |
| 2 | Application of pressing force per 1 end plug, MPa | 22-25 |
| 3 | Heating of furnace to sintering temperature for time period, minutes | 180 |
| 4 | Sintering temperature, ° C. | 1850 |
| 5 | Holding at sintering temperature for, minutes | 120 |
| 6 | Switching-off heating of furnace and cooling to temperature, ° C. | 100 |
| 7 | Removing pressing force when furnace temperature was, ° C. | 100 |

After sintering, the samples were pressed out of the die, cleaned and transported for studying their mechanical properties.

Thus, the invention ensures:
improvement in mechanical strength properties of a ceramic multilayered tube for cladding of a fuel element, in particular owing to eliminating the possibility of brittle destruction of a product when a load is applied, due to the presence of an intermediate strengthening layer of a reinforcing thread framework in the form of a long-length cord of fiber having a ?-SiC structure, which is produced by biaxial or triaxial braiding in a braiding machine and which braided structure exhibits better resistance to arising stresses and is capable of withstanding greater loads compared to the winding structure; furthermore, the results of the tests conducted showed high strength characteristics of the product;

improvement in neutron-physical characteristics of the product due to lack of foreign impurities;

provision of tightness and protection to the load-bearing central layer in the composite owing to the presence of the gas-tight inner layer and the protective corrosion-resistant outer layer that are manufactured from monolithic beta phase stoichiometric silicon carbide;

safety to the environment owing to the absence of ecologically hazardous substances, in particular chlorine, since the proposed method for producing crystals of beta phase stoichiometric silicon carbide by chemical vapor deposition technique uses components that do not contain chlorine, which reduces environmental impact;

provision of sealed ends of the fuel element tube, in particular owing to development of a geometric shape, material composition and method for producing plugs for sealing tubular elements made of silicon carbide.

We claim:

1. A method for producing ceramic multilayered tube used as a cladding fora fuel element in nuclear power plant, comprising successive formation of layers, the method comprising the steps of:

forming an inner monolithic layer having a thickness of 250-500 μm and being comprised of crystals of beta phase stoichiometric silicon carbide on a carbon substrate being a rod, by chemical methylsilane vapor deposition in a sealed tubular hot-wall chemical vapor deposition reactor (CVD reactor) at a forming the inner monolithic layer operating temperature of 660-730 degrees C. and pressure of 50-100 Pa for 60-100 hours, wherein the step of forming the inner monolithic layer comprises the step of feeding gaseous argon to the CVD reactor at an operating temperature of 660-730 degrees C. and pressure of 50-100 Pa for 60-100 hours, when the CVD reactor at the forming the inner monolithic layer operating temperature of 660-730 degrees C. and pressure of 50-100 Pa for 60-100 hours is heated from room temperature to the forming the inner monolithic layer operating temperature and is cooled from the forming the inner monolithic layer operating temperature to the room temperature, forming a central composite layer having a thickness of 300-500 μm over the inner monolithic layer, wherein the step of forming said central composite layer comprises the steps of:

twisting continuous stoichiometric fibers of beta phase silicon carbide having a diameter of 10-15 μm into tows of 500-1500 fibers, transporting the tows to a braiding machine for biaxial or triaxial braiding, forming a cord as a reinforcing thread framework by the braiding machine, arranging the cord over the inner monolithic layer disposed on the carbon substrate, the cord having fixed ends, building up a pyrocarbon interface coating on the cord to a thickness of 100-200 nm by chemical methane vapor deposition in a sealed tubular hot-wall chemical vapor deposition reactor (CVD reactor) at a building up the pyrocarbon interface operating temperature of 1000-1050 degrees C. and pressure of 100-200 Pa for 1.5-2 hours, wherein the step of building up the pyrocarbon interface comprises the step of feeding gaseous argon to the CVD reactor at the building up the pyrocarbon interface operating temperature of 1000-1050 degrees C. and pressure of 100-200 Pa for 1.5-2 hours when the CVD reactor at the building up the pyrocarbon interface operating temperature of 1000-1050 degrees C. and pressure of 100-200 Pa for 1.5-2 hours is heated from the room temperature to the building up the pyrocarbon interface operating temperature, and forming a matrix from crystals of beta phase stoichiometric silicon carbide inside the cord by chemical methylsilane vapor deposition in a sealed tubular hot-wall chemical vapor deposition reactor (CVD reactor) at a forming the matrix operating temperature of 660-730 degrees C. and pressure of 50-100 Pa for 5-10 hours, wherein the step of forming the matrix comprises the step of feeding gaseous argon to the CVD reactor at the forming the matrix operating temperature of 660-730 degrees C. and pressure of 50-100 Pa for 5-10 hours when the CVD reactor at the forming the matrix operating temperature of 660-730 degrees C. and pressure of 50-100 Pa for 5-10 hours is cooled from the forming the matrix operating temperature to the room temperature;

forming a protective outer monolithic layer with the thickness of 100 μm from crystals of beta phase stoichiometric silicon carbide over the central composite layer by chemical methylsilane vapor deposition in a sealed tubular hot-wall chemical vapor deposition reactor (CVD reactor) at a forming the protective outer monolitihic operating temperature of 660-730 degrees C. and pressure of 50-100 Pa for 10-20 hours so as to form a fabricated semi-finished product on the carbon substrate, wherein the step of forming the protective outer monolithic layer comprises the step of feeding gaseous argon to the CVD reactor at the forming the protective outer monolitihic operating temperature of 660-730 degrees C. and pressure of 50-100 Pa for 10-20 hours when the CVD reactor at the forming the protective outer monolitihic operating temperature of 660-730 degrees C. and pressure of 50-100 Pa for 10-20 hours is heated from the room temperature to the forming the protective outer monolitihic operating temperature and cooled from the forming the protective outer monolitihic operating temperature to the room temperature; and removing the carbon substrate from said fabricated semi-finished product, said fabricated semi-finished product being comprised of the inner monolithic layer, the central composite layer, and the protective outer monolithic layer.

2. The method for producing, according to claim 1, wherein said carbon substrate is comprised of a graphite rod.

3. The method for producing, according to claim 2, wherein said graphite rod has a diameter of 7.7 mm.

4. The method for producing, according to claim 2, further comprising the step of:

preparing the graphite rod by removal of sorption moisture, wherein the step of preparing the graphite rod comprises the steps of:

wiping the graphite rod with a cotton fabric, placing the graphite rod in a vacuum furnace, heating the graphite rod in an argon atmosphere to a temperature of 100 degrees C. at an argon pressure of 0.3 Pa, holding the graphite rod at the temperature of 100 degrees C. for 3 hours, switching the vacuum furnace off, holding the graphite rod at the argon pressure of 0.3 Pa for 21 hours, and removing the graphite rod from the vacuum furnace.

5. The method for producing, according to claim 1, wherein, in the step of forming the inner monolithic layer, the step of feeding gaseous argon to the CVD reactor at the forming the inner monolithic layer operating temperature of 660-730 degrees C. and pressure of 50-100 Pa for 60-100 hours is at a flowrate of 1 L/h.

6. The method for producing, according to claim 1, wherein the step of forming the inner monolithic layer further comprises the step of feeding gaseous methylsilane to the CVD reactor at another forming the inner monolithic layer operating temperature of 660-730 degrees C. and pressure of 50-100 Pa for 60-100 hours at a flowrate of 1 L/h.

7. The method for producing, according to claim 1, wherein the step of transporting the tows to the braiding machine comprises the step of transporting the tows in fiber orientation of 45 degrees×45 degrees and a braiding density of 3 by 1 cm for biaxial braiding.

8. The method for producing, according to claim 1, wherein the step of transporting the tows to the braiding machine comprises the step of transporting the tows in fiber orientation of 45 degrees×45 degrees×0 degrees with four axial fibers and a braiding density of 2.75 by 1 cm for triaxial braiding.

9. The method for producing, according to claim 1, wherein the tows are comprised of continuous beta phase stoichiometric silicon carbide fibers, and
   wherein the step of transporting the tows to the braiding machine comprises the step of transportation the tow in fiber orientation of 45 degrees×45 degrees×0 degrees with eight axial fibers and a braiding density of 2.5 by 1 cm for triaxial braiding.

10. The method for producing, according to claim 1, wherein, in the step of building up the pyrocarbon interface coating, the step of feeding gaseous argon to the CVD reactor at the building up the pyrocarbon interface operating temperature of 1000-1050 degrees C. and pressure of 100-200 Pa for 1.5-2 hours is at a flowrate of 1 L/h.

11. The method for producing, according to claim 1, wherein, in the step of forming the matrix, the step of feeding gaseous methane to the CVD reactor at the forming the matrix operating temperature of 660-730 degrees C. and pressure of 50-100 Pa for 5-10 hours is at a flowrate of 3 L/h.

12. The method for producing, according to claim 1, wherein the step of forming the matrix further comprises the step of feeding gaseous methylsilane to the CVD reactor at another forming the matrix operating temperature of 660-730 degrees C. and pressure of 50-100 Pa for 5-10 hours at a flowrate of 1 L/h.

13. The method for producing, according to claim 1, wherein, in the step of forming the protective outer monolithic layer, the step of feeding gaseous argon to the CVD reactor at the forming the protective outer monolithic operating temperature of 660-730 degrees C. and pressure of 50-100 Pa for 10-20 hours is at a flowrate of 1 L/h.

14. The method for producing, according to claim 1, wherein the step of forming the protective outer monolithic layer further comprises the step of feeding gaseous methylsilane to the CVD reactor at another forming the protective outer monolithic layer operating temperature of 660-730 degrees C. and pressure of 50-100 Pa for 10-20 hours at a flowrate of 1 L/h.

15. The method for producing, according to claim 1, wherein the step of removing the carbon substrate is by oxidation in air at a temperature of 700-1000 degrees C.

* * * * *